(12) United States Patent
Kim et al.

(10) Patent No.: US 9,099,561 B2
(45) Date of Patent: Aug. 4, 2015

(54) TRANSISTORS AND ELECTRONIC DEVICES INCLUDING THE TRANSISTORS

(75) Inventors: Hyun-suk Kim, Hwaseong-si (KR); Sang-yoon Lee, Seoul (KR); Myung-kwan Ryu, Yongin-si (KR); Tae-sang Kim, Seoul (KR); Jong-baek Seon, Yongin-si (KR); Kyoung-seok Son, Seoul (KR); Won-mook Choi, Hwaseong-si (KR); Joon-seok Park, Seongnam-si (KR); Mi-jeong Song, Suwon-si (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/489,888

(22) Filed: Jun. 6, 2012

(65) Prior Publication Data

US 2013/0043475 A1    Feb. 21, 2013

(30) Foreign Application Priority Data

Aug. 17, 2011 (KR) .................. 10-2011-0081814

(51) Int. Cl.
*H01L 29/786* (2006.01)

(52) U.S. Cl.
CPC ...... *H01L 29/78633* (2013.01); *H01L 29/7869* (2013.01); *H01L 29/78669* (2013.01); *H01L 29/78678* (2013.01)

(58) Field of Classification Search
CPC ............ H01L 29/786; H01L 29/78633
USPC ............................. 257/40, E29.273
See application file for complete search history.

(56) References Cited

U.S. PATENT DOCUMENTS

| | | | |
|---|---|---|---|
| 7,129,636 B2 * | 10/2006 | Chang | 313/506 |
| 7,230,267 B2 * | 6/2007 | Nagayama et al. | 257/40 |
| 2002/0063261 A1 | 5/2002 | Zhang | |
| 2009/0230390 A1 * | 9/2009 | Gosain et al. | 257/43 |
| 2009/0261332 A1 * | 10/2009 | Shin et al. | 257/59 |
| 2010/0321279 A1 * | 12/2010 | Jung et al. | 345/76 |
| 2013/0015409 A1 * | 1/2013 | Fugetsu | 252/500 |

FOREIGN PATENT DOCUMENTS

| | | |
|---|---|---|
| JP | 08-167719 A | 6/1996 |
| KR | 2000-258802 A | 9/2000 |
| KR | 20090078631 A | 7/2009 |
| KR | 2009-0098679 A | 9/2009 |

(Continued)

OTHER PUBLICATIONS

Seo et al. ("Fully Transparent InGaZnO thin film transistors using indium tin oxide/graphene multilayer as source/drain electrodes." Appl Phys. Lett. 97, 172106 (2010)).*

(Continued)

*Primary Examiner* — Cheung Lee
*Assistant Examiner* — Stephen Bradley
(74) *Attorney, Agent, or Firm* — Harness, Dickey & Pierce

(57) ABSTRACT

A transistor may include a light-blocking layer that blocks light incident on a channel layer. The light-blocking layer may include a carbon-based material. The carbon-based material may include graphene oxide, graphite oxide, graphene or carbon nanotube (CNT). The light-blocking layer may be between a gate and at least one of the channel layer, a source and a drain.

27 Claims, 9 Drawing Sheets

(56) References Cited

FOREIGN PATENT DOCUMENTS

| | | |
|---|---|---|
| KR | 2009-0110099 A | 10/2009 |
| KR | 20100132308 A | 12/2010 |
| WO | WO-2007013009 A2 | 2/2007 |

OTHER PUBLICATIONS

"Graphene oxide as a chemically tunable platform for optical applications." Nature Chemistry, vol. 2, Dec. 2010, pp. 1015-1024.*

Liang, C. et al., "A Novel Self-Aligned Etch-Stopper Structure With Lower Photo Leakage for AMLCD and Sensor Applications", IEEE Electron Device Letters, vol. 27, No. 12, Dec. 2006.

Chen, C. et al., "High Performance Hydrogenated Amorphous-Si TFT for AMLCD and AMOLED Applications", IEEE Electron Device Letters, vol. 26, No. 10, Oct. 2005.

Kamada, Y., et al., "Photo-Leakage Current of Zinc Oxide Thin-Film Transistors", Japanese Journal of Applied Physics 49, 2010.

H. Lu. et al., "Elimination of Photoleakage Current in Poly-Si TFTs Using a Metal-Shielding Structure," *Electrochemical and Solid-State Letters*, vol. 11, No. 5, pp. J34-J36 (2003).

* cited by examiner

TRANSISTORS AND ELECTRONIC DEVICES INCLUDING THE TRANSISTORS

CROSS-REFERENCE TO RELATED APPLICATION

This application claims the benefit of Korean Patent Application No. 10-2011-0081814, filed on Aug. 17, 2011, in the Korean Intellectual Property Office, the disclosure of which is incorporated herein in its entirety by reference.

BACKGROUND

1. Field

Some example embodiments relate to transistors, methods of manufacturing the same, and electronic devices including the transistors.

2. Description of the Related Art

Transistors are widely used as switching devices or driving devices in electronic devices. In particular, since thin film transistors can be manufactured on glass substrates or plastic substrates, they are efficiently used in the field of flat panel display devices such as liquid crystal display devices and organic light-emitting display devices.

However, when transistors are applied to optical devices such as flat panel display devices, the characteristics of the transistors may be changed by light. Particularly, in a transistor having an oxide semiconductor as a channel layer (an oxide transistor), the oxide semiconductor channel layer is sensitive to light, and thus, the characteristics of the transistor may be changed by light.

SUMMARY

Some example embodiments provide transistors of which characteristic variation due to light is suppressed. Some example embodiments provide methods of manufacturing the transistors. Some example embodiments provide electronic devices including the transistors.

Additional aspects will be set forth in part in the description which follows and, in part, will be apparent from the description, or may be learned by practice of example embodiments.

According to an example embodiment, a transistor includes a channel layer apart from a gate, a source contacting a first region of the channel layer and a drain contacting a second region of the channel layer, and a light-blocking layer between the gate and at least one of the channel layer, the source and the drain. The light-blocking layer includes a carbon-based material The carbon-based material may have a bandgap less than about 5.0 eV. The light-blocking layer may be a light-absorbing layer. The carbon-based material may be an insulator. The carbon-based material may include at least one of graphene oxide and graphite oxide. The carbon-based material may be a conductor. The carbon-based material may include at least one of graphene and carbon nanotube (CNT). A gate insulating layer may be between the gate and the channel layer. The gate insulating layer may include the light-blocking layer.

The gate insulating layer may include a first insulating layer between the gate and the channel layer, and a second insulating layer between the first insulating layer and the channel layer. One of the first and second insulating layers is the light-blocking layer. The gate insulating layer may further include a third insulating layer between the second insulating layer and the channel layer.

A gate insulating layer may be configured to cover the gate, and the channel layer, the source, and the drain may be on the gate insulating layer. The light-blocking layer may include a first light-blocking layer between the source and the gate insulating layer, and a second light-blocking layer between the drain and the gate insulating layer.

The first and second light-blocking layers may be one of a conductor and an insulator. The first light-blocking layer may extend between the source and the channel layer, and the second light-blocking layer may extend between the drain and the channel layer.

The method may further include a third light-blocking layer between the gate and the gate insulating layer. The third light-blocking layer may be one of a conductor and an insulator. The channel layer may include an oxide semiconductor. The channel layer may include a non-oxide semiconductor. The channel layer may be on the gate. The gate may include an opaque material.

According to another example embodiment, a transistor includes a channel layer apart from a gate, a source contacting a first region of the channel layer and a drain contacting a second region of the channel layer, and a light-blocking member configured to block laterally incident light toward the channel layer. The light-blocking member includes a carbon-based material.

The carbon-based material may be an insulator. The carbon-based material may include at least one of graphene oxide and graphite oxide. The carbon-based material may be a conductor. The carbon-based material may include at least one of graphene and carbon nanotube (CNT).

According to another example embodiment, a flat panel display device includes the transistor. The flat panel display device may be one of a liquid crystal display device and an organic light-emitting display device. The transistor may be used as one of a switching device and a driving device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
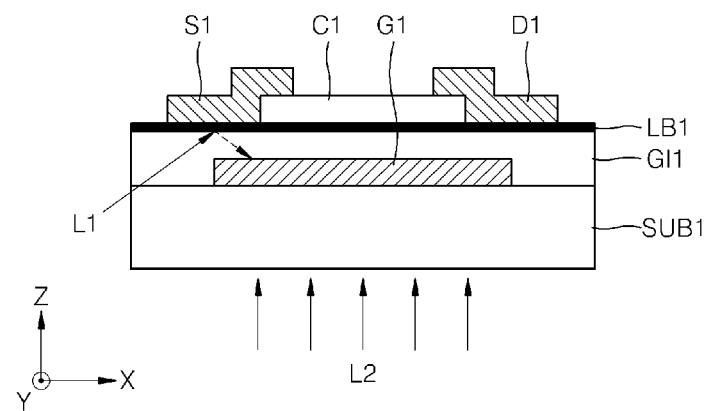
FIG. 1 is a cross-sectional view of a transistor according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of a transistor according to an example embodiment. Referring to FIG. 1, a gate G1 may be disposed on a substrate SUB1. The substrate SUB1 may be a glass substrate or may be any substrate used in a general semiconductor device process, for example, a plastic substrate, a silicon substrate, or the like. After an insulating material layer (not shown) is formed on the substrate SUB1, the gate G1 may be formed thereon. The insulating material layer may be, for example, a silicon oxide layer.

The gate G1 may be formed of a conventional electrode material, such as metal and a conductive oxide. The gate G1 may be opaque. A gate insulating layer GI1 may be disposed on the substrate SUB1 so as to cover the gate G1. The gate insulating layer GI1 may include silicon oxide, silicon oxynitride, or silicon nitride, or any other materials such as a high-k dielectric material having a higher dielectric constant than the silicon nitride. The gate insulating layer GI1 may have a single-layer or multi-layer structure.

A light-blocking layer LB1 may be disposed on the gate insulating layer GI1. The light-blocking layer LB1 may be an insulating layer including a carbon-based material. For example, the light-blocking layer LB1 may include graphene oxide or graphite oxide as the carbon-based material. The carbon-based material of the light-blocking layer LB1 may have a bandgap less than about 5.0 eV. Bandgaps of the graphene oxide and the graphite oxide may respectively be about 2.4 eV. Since the light-blocking layer LB1 including the carbon-based material has a lower bandgap, the light-blocking layer LB1 may absorb light. Accordingly, the light-blocking layer LB1 may be regarded as a 'light-absorbing layer'. In addition, since the carbon-based material is black, the light-blocking layer LB1 may be a black layer. Functions of the light-blocking layer LB1 will be described later in more detail.

The light-blocking layer LB1, which is an insulating layer interposed between the gate G1 and a channel layer C1, may be regarded as a gate insulating layer. Thus, the gate insulating layer GI1 may be referred to as a first gate insulating layer, and the light-blocking layer LB1 may be referred to as a second gate insulating layer. In this regard, the gate insulating layer GI1 and the light-blocking layer LB1 may constitute a gate insulating layer having a multi-layer structure. The multi-layered gate insulating layer GI1+LB1 includes first and second insulating layers, wherein the first insulating layer may be the gate insulating layer GI1, and the second insulating layer may be the light-blocking layer LB1.

The channel layer C1 may be disposed on the light-blocking layer LB1. The channel layer C1 may be disposed above the gate G1. The width of the channel layer C1 in the X-axis direction may be relatively less than the width of the gate G1 in the X-axis direction. However, the width of the channel layer C1 with respect to the gate G1 is illustrative and may vary. If desired, the width of the gate G1 may be similar to or less than that of the channel layer C1. The channel layer C1 may include an oxide semiconductor. For example, the channel layer C1 may include a ZnO-based oxide semiconductor. However, the ZnO-based oxide semiconductor is illustrative and any other oxide semiconductors may also be used.

If the channel layer C1 includes an oxide semiconductor, the characteristics of the transistor may be improved due to desirable properties of the oxide semiconductor, such as high mobility. However, the material used to form the channel layer C1 does not preclude a non-oxide semiconductor. That is, the channel layer C1 may also be formed of a non-oxide semiconductor. In this case, the channel layer C1 may include amorphous silicon or polycrystalline silicon, or various compound semiconductors (non-oxide semiconductors).

A source electrode S1 and a drain electrode D1 may be disposed on the light-blocking layer LB1 so as to respectively contact both ends of the channel layer C1. The source electrode S1 may contact a first end of the channel layer C1 and extend on a portion of the light-blocking layer LB1 at the first end of the channel layer C1. Similarly, the drain electrode D1 may contact a second end of the channel layer C1 and extend on a portion of the light-blocking layer LB1 at the second end of the channel layer C1. The source electrode S1 and the drain electrode D1 may include the same material as the gate G1 or different material than the gate G1. The source electrode S1 and the drain electrode D1 may have a single-layer or multi-layer structure.

Functions of the light-blocking layer LB1 will be described in more detail. The light-blocking layer LB1 may block a laterally incident light L1 that is incident into the channel layer C1. That is, the light-blocking layer LB1 may block light that is laterally incident from a side of the transistor toward the channel layer C1, that is, the laterally incident light L1. The laterally incident light L1 that is irradiated on the light-blocking layer LB1 may be mostly absorbed by the light-blocking layer LB1 and partially reflected toward the gate G1. Light L2 incident from below the channel layer C1 may be mostly blocked by the gate G1. If the light-blocking layer LB1 is not included, light is easily incident from sides of the transistor on the channel layer C1, and thus, characteristics of the channel layer C1 may be changed.

A flat panel display device may include a backlight unit (not shown) below a lower substrate that includes a transistor array and a pixel electrode array, and light may be irradiated by the backlight unit onto the lower substrate. In this regard, if a large amount of light is incident on the transistor, the characteristics of the transistor may be changed, and thus, reliability of the flat panel display device may be deteriorated. However, as in the current embodiment, if the laterally incident light L1 that is laterally incident from a side of the transistor toward the channel layer C1 is blocked by using the light-blocking layer LB1, reliability of the transistor with regard to light may be improved.

Figure 2:
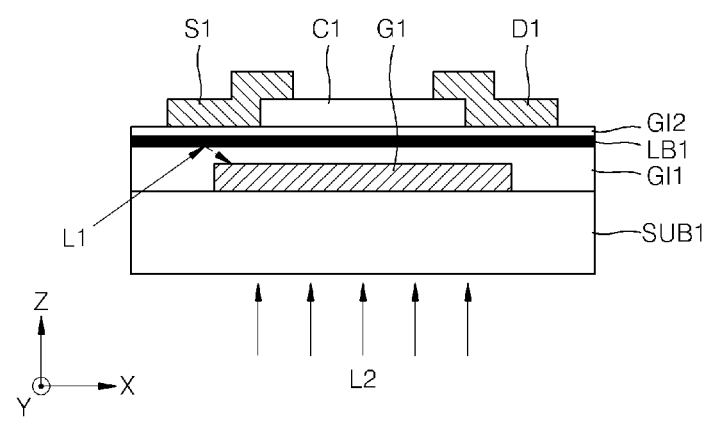
FIG. 2 is a cross-sectional view of a transistor according to another example embodiment.

The structure of the transistor shown in FIG. 1 may be changed. For example, in FIG. 1, the light-blocking layer LB1 is disposed on the gate insulating layer GI1. However, according to another embodiment, the light-blocking layer LB1 may be disposed within the gate insulating layer GI1. That is, the light-blocking layer LB1 may be interposed between a lower gate insulating layer and an upper gate insulating layer. An example thereof is shown in FIG. 2. FIG. 2 is a cross-sectional view of a transistor according to another example embodiment.

Referring to FIG. 2, a lower gate insulating layer GI1 may be disposed to cover the gate G1, and an upper gate insulating layer GI2 may be disposed thereon. The light-blocking layer LB1 may be disposed between the lower gate insulating layer GI1 and the upper gate insulating layer GI2. The light-blocking layer LB1 may be regarded as a portion of a gate insulating layer. Accordingly, the lower gate insulating layer GI1 may be referred to as a first gate insulating layer, the light-blocking layer LB1 may be referred to as a second gate insulating layer, and the upper gate insulating layer GI2 may be referred to as a third gate insulating layer. In this regard, the lower gate insulating layer GI1, the light-blocking layer LB1, and the upper gate insulating layer GI2 may constitute a gate insulating layer having a multi-layer structure. In the structure shown in FIG. 2, the light-blocking layer LB1 may block the laterally incident light L1 incident on the channel layer C1.

Figure 3:
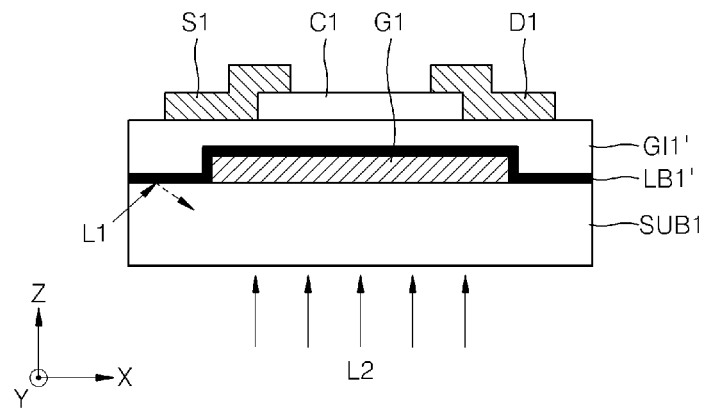
FIG. 3 is a cross-sectional view of a transistor according to another example embodiment.

In FIG. 1, the light-blocking layer LB1 is disposed on the gate insulating layer GI1. However, according to another example embodiment, the positions of the light-blocking layer LB1 and the gate insulating layer GI1 may be exchanged. An example thereof is shown in FIG. 3. FIG. 3 is a cross-sectional view of a transistor according to another example embodiment.

Referring to FIG. 3, a light-blocking layer LB1' may be disposed to cover the gate G1, and a gate insulating layer GI1' may be disposed on the light-blocking layer LB1'. In this case, the light-blocking layer LB1' may be referred to as a first gate insulating layer, and the gate insulating layer GI1' may be referred to as a second gate insulating layer. Accordingly, the light-blocking layer LB1' and the gate insulating layer GI1' may constitute a gate insulating layer having a multi-layer structure.

The multi-layered gate insulating layer LB1'+GI1' includes the first insulating layer and the second insulating layer, wherein the first insulating layer may be the light-blocking layer LB1', and the second insulating layer may be the gate insulating layer GI1'. A channel layer C1, a source electrode S1, and a drain electrode D1 may be disposed on the gate insulating layer GI1'. In the structure shown in FIG. 3, the light-blocking layer LB1 may block the laterally incident light L1 incident on the channel layer C1.

If the light-blocking layers LB1 and LB1' are not included in the structures shown in FIGS. 1 to 3, light L1 may be more easily incident from a side of the transistor on the channel layer C1. The light L1 may be incident on the channel layer C1 directly or by multiple reflections. Thus, if the light-blocking layers LB1 and LB1' are not provided, the characteristics of the channel layer C1 may be more easily changed by light. If the channel layer C1 is an oxide semiconductor layer that is sensitive to light, the characteristics thereof may be more easily changed. However, in the light-blocking layers LB1 and LB1' according to the embodiments illustrated in FIGS. 1 to 3, the laterally incident light L1 may be prevented or inhibited from being incident on the channel layer C1.

In the structures shown in FIGS. 1 to 3, the light-blocking layers LB1 and LB1' may block not only the laterally incident light L1 but also light L2 incident from below the channel layer C1 (hereinafter, referred to as bottom incident light). If the gate G1 is transparent, the gate G1 cannot block the bottom incident light L2. However, since the light-blocking layers LB1 and LB1' extend to screen the bottom surface of the channel layer C1 and the bottom surfaces of the source/drain electrodes S1 and D1 that are disposed at both sides of the channel layer C1, the bottom incident light L2 may be efficiently blocked by the light-blocking layers LB1 and LB1'.

Additionally, FIGS. 1 to 3 show different gate insulating layers GI1, GI1', and GI2 with the light-blocking layers LB1 and LB1'. However, if desired, different gate insulating layers GI1, GI1', and GI2 may not be used. That is, since the light-blocking layers LB1 and LB1' may function as gate insulating layers, the different gate insulating layers GI1, GI1', and GI2 may not be used.

Figure 4:
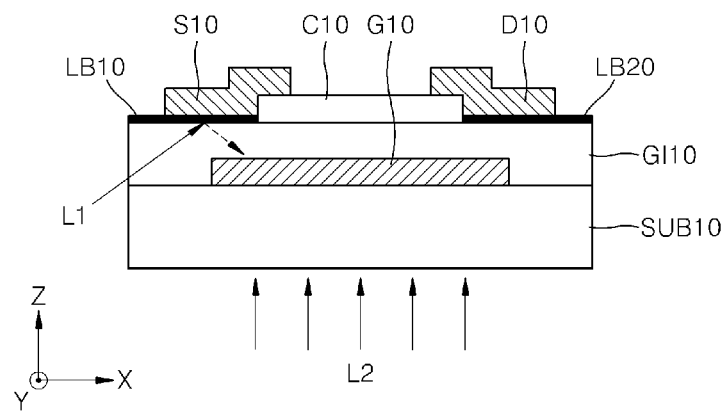
FIG. 4 is a cross-sectional view of a transistor according to another example embodiment.

FIG. 4 is a cross-sectional view of a transistor according to another example embodiment. Referring to FIG. 4, a gate G10 may be disposed on a substrate SUB10, and a gate insulating layer GI10 may be disposed to cover the gate G10. The material and structure of the substrate SUB10, the gate G10, and the gate insulating layer GI10 may be substantially the same as or similar to those of the substrate SUB1, the gate G1, and the gate insulating layer GI1 of FIG. 1, respectively. A channel layer C10 may be disposed on the gate insulating layer GI10, and a source electrode S10 and a drain electrode D10 may be disposed to respectively contact both ends of the channel layer C10. The material and structure of the channel layer C10, the source electrode S10, and the drain electrode D10 may be substantially the same as or similar to those of the channel layer C1, the source electrode S1, and the drain electrode D1 of FIG. 1, respectively.

A first light-blocking layer LB10 may be disposed between the source electrode S10 and the gate insulating layer GI10, and a second light-blocking layer LB20 may be disposed between the drain electrode D10 and the gate insulating layer GI10. The first light-blocking layer LB10 may be disposed on the gate insulating layer GI10 to extend to outside of the source electrode S10. Similarly, the second light-blocking layer LB20 may be disposed on the gate insulating layer GI10 to extend to outside of the drain electrode D10.

The first and second light-blocking layers LB10 and LB20 may include a conductor including a carbon-based material. For example, the first and second light-blocking layers LB10 and LB20 may include graphene or carbon nanotube (CNT) as the carbon-based material (conductor). If the first and second light-blocking layers LB10 and LB20 include graphene, each of the first and second light-blocking layers LB10 and LB20 may have a structure in which several to several tens of layers, for example, about 1 to 10 layers, of graphene are stacked. If the first and second light-blocking layers LB10 and LB20 include CNT, each of the first and second light-blocking layers LB10 and LB20 may have a network structure including a plurality of CNTs.

Since conductive carbon-based materials such as graphene and CNT have a bandgap of zero (0) or close to zero, the first and second light-blocking layers LB10 and LB20, including the conductive carbon-based materials, may function as a 'light-absorbing layer'. In particular, the bandgap of graphene is linearly changed externally from a Dirac point, and thus, graphene may absorb light in a wide wavelength range. In addition, since the graphene and CNT are black materials, the first and second light-blocking layers LB10 and LB20 may be black layers. The first and second light-blocking layers LB10 and LB20 including the carbon-based material may block the laterally incident light L1 incident on the channel layer C10. As such, if the first and second light-blocking layers LB10 and LB20 are conductors, they may be regarded as portions of the source electrode S10 and the drain electrode D10, respectively.

The first and second light-blocking layers LB10 and LB20 may include a carbon-based insulator, as the light-blocking layer LB1 of FIG. 1. That is, the first and second light-blocking layers LB10 and LB20 may include a carbon-based insulator such as graphene oxide or graphite oxide. In FIG. 4, the structure of the first and second light-blocking layers LB10 and LB20 may be modified variously. Examples thereof are shown in FIGS. 5 to 7.

Figure 5:
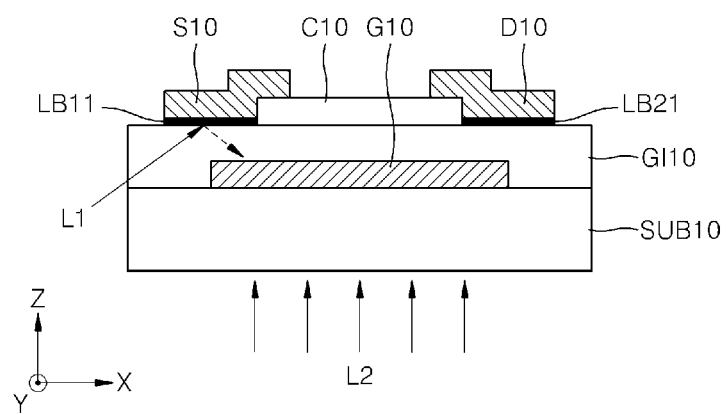
FIG. 5 is a cross-sectional view of a transistor according to another example embodiment.

Referring to FIG. 5, first and second light-blocking layers LB11 and LB21 may respectively have a structure that does not extend to outside of the source electrode S10 and the drain electrode D10 (non-extending structure).

Figure 6:
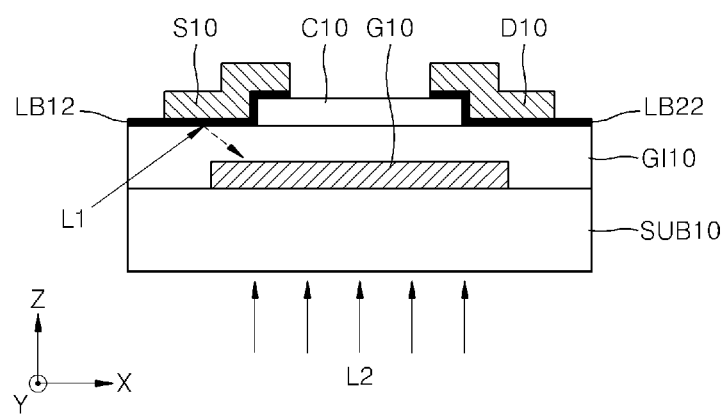
FIG. 6 is a cross-sectional view of a transistor according to another example embodiment.

Referring to FIG. 6, a first light-blocking layer LB12 may have a structure extending between the source electrode S10 and the channel layer C10. Similarly, a second light-blocking layer LB22 may have a structure extending between the drain electrode D10 and the channel layer C10. In this case, the first and second light-blocking layers LB12 and LB22 may be formed of conductors. The conductor may include a carbon-based material such as graphene or CNT. The first and second light-blocking layers LB12 and LB22 are formed on the gate insulating layer GI10 to extend to outside of the source electrode S10 and the drain electrode D10 in FIG. 6, respectively. If desired, however, as shown in FIG. 5, the first and second light-blocking layers LB12 and LB22 may not extend.

Figure 7:
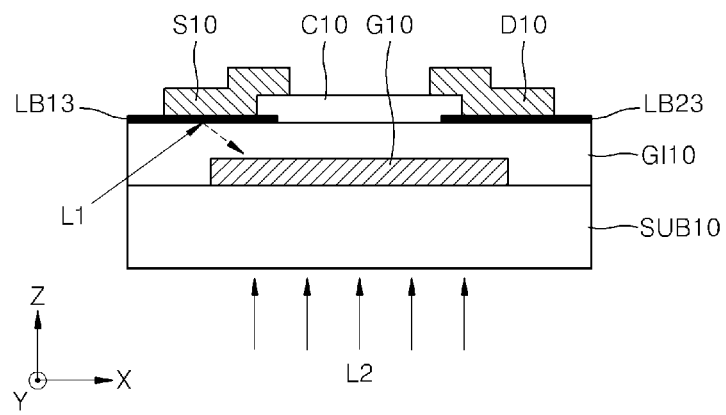
FIG. 7 is a cross-sectional view of a transistor according to another example embodiment.

Referring to FIG. 7, first and second light-blocking layers LB13 and LB23 may respectively extend between the channel layer C10 and the gate insulating layer GI10 by a predetermined or given length. In other words, the channel layer C10 may have a structure that covers the ends of the first and second light-blocking layers LB13 and LB23. As such, if the first and second light-blocking layers LB13 and LB23 have a structure extending between the channel layer C10 and the gate insulating layer GI10, the laterally incident light L1 may be more efficiently blocked by the first and second light-blocking layers LB13 and LB23.

Figure 8:
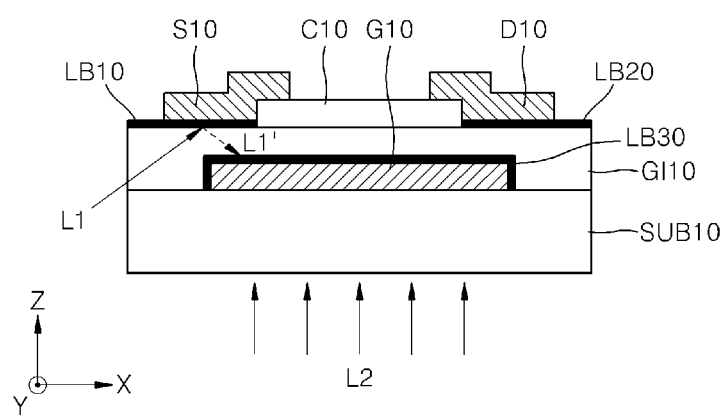
FIG. 8 is a cross-sectional view of a transistor according to another example embodiment.

FIG. 8 is a cross-sectional view of a transistor according to another example embodiment. The transistor has a structure modified from that shown in FIG. 4. Referring to FIG. 8, a third light-blocking layer LB30 may further be disposed to cover the gate G10. The third light-blocking layer LB30 may include a conductor or insulator including a carbon-based material. For example, the third light-blocking layer LB30 may include a carbon-based conductor such as graphene or CNT, or a carbon-based insulator such as graphene oxide or graphite oxide. The structure shown in FIG. 8 may be the same as that shown in FIG. 4, except that the third light-blocking layer LB30 is provided.

If the third light-blocking layer LB30 is further provided as shown in FIG. 8, light L1' that is not absorbed by the first or second light-blocking layers LB10 and LB20 and reflected may be incident on the third light-blocking layer LB30 and absorbed thereby. Thus, a light blocking effect may be improved by the third light-blocking layer LB30. In addition, the third light-blocking layer LB30 may block the bottom incident light L2. If the gate G10 is transparent or semi-transparent, the effect of blocking the bottom incident light L2 may be improved by the third light-blocking layer LB30.

In FIG. 8, the third light-blocking layer LB30 has a structure that covers the top surface and both sides of the gate G10. However, this structure of the third light-blocking layer LB30 may be modified variously. An example thereof is shown in FIG. 9.

Figure 9:
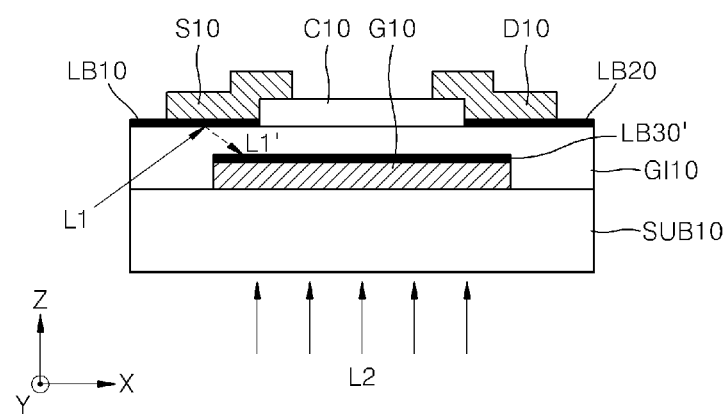
FIG. 9 is a cross-sectional view of a transistor according to another example embodiment.

Referring to FIG. 9, a third light-blocking layer LB30' may be formed only on the top surface of the gate G10. That is, both sides of the gate G10 may not be covered by the third light-blocking layer LB30'. In this case, the light L1' that is not absorbed by the first or second light-blocking layer LB10 or LB20 and reflected may be absorbed by the third light-blocking layer LB30'. In addition, the third light-blocking layer LB30' may block the bottom incident light L2.

FIGS. 8 and 9 show third light-blocking layers LB30 and LB30' added to the structure of FIG. 4. Similarly, third light-blocking layers LB30 and LB30' may also be applied to the structures shown in FIGS. 5 to 7.

As such, according to example embodiments, light-blocking layers LB1, LB1', LB10 to LB13, LB20 to LB23, LB30, and LB30' are disposed between the gate G1 and G10 and at least one of the channel layer C1 and C10, the source electrode S1 and S10, and the drain electrode D1 and D10. As a result, light incident on the channel layers C1 and C10 from sides and bottom of the transistor may be blocked, so that changes of characteristics of the channel layers C1 and C10 and changes of characteristics of the transistor may be reduced.

In addition, at least two of the structures of the light-blocking layers shown in FIGS. 1 to 9 may be combined with each other. For example, one of the light-blocking layers shown in FIGS. 1 to 3 may be combined with one of the light-blocking layers shown in FIGS. 4 to 9.

Figure 10A:
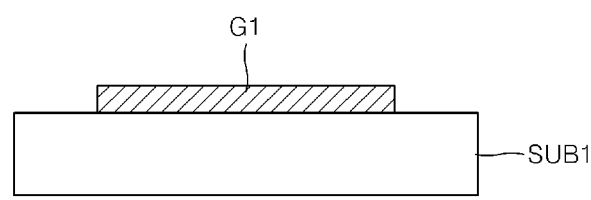
FIGS. 10A to 10C are cross-sectional views illustrating a method of manufacturing a transistor, according to an example embodiment.
Figure 10B:
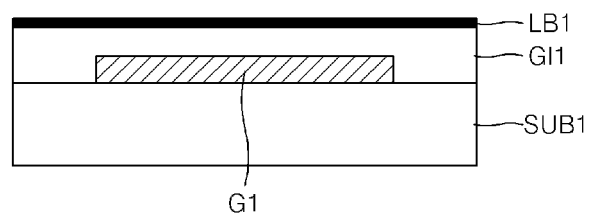
Figure 10C:
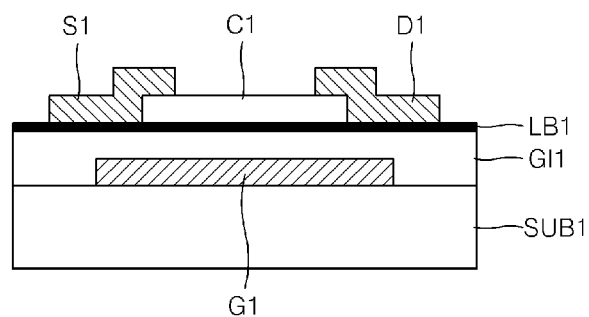

FIGS. 10A to 10C are cross-sectional views illustrating a method of manufacturing a transistor, according to an example embodiment. According to the current embodiment, a method of manufacturing the transistor shown in FIG. 1 is provided.

Referring to FIG. 10A, a gate G1 may be formed on a substrate SUB1. The substrate SUB1 may be a glass substrate or may be any substrate used in a conventional semiconductor device process, for example, a plastic substrate, a silicon substrate, or the like. After an insulating material layer (not shown) is formed on the substrate SUB1, the gate G1 may be formed thereon. The insulating material layer may be, for example, a silicon oxide layer. The gate G1 may be formed of a conventional electrode material, such as metal and a conductive oxide. The gate G1 may be opaque.

Referring to FIG. 10B, a gate insulating layer GI1 may be formed so as to cover the gate G1. The gate insulating layer GI1 may include silicon oxide, silicon oxynitride, or silicon nitride, or any other materials such as a high-k dielectric material having a higher dielectric constant than the silicon nitride. The gate insulating layer GI1 may have a single-layer or multi-layer structure. A light-blocking layer LB1 may be formed on the gate insulating layer GI1. The light-blocking layer LB1 may include a carbon-based material (insulator).

For example, the light-blocking layer LB1 may include graphene oxide or graphite oxide. The carbon-based material of the light-blocking layer LB1 may have a bandgap less than about 5.0 eV. Bandgaps of the graphene oxide and the graphite oxide may respectively be about 2.4 eV. The light-blocking layer LB1 that is an insulating layer may be regarded as a portion of a gate insulating layer. Thus, the gate insulating layer GI1 may be referred to as a first gate insulating layer, and the light-blocking layer LB1 may be referred to as a second gate insulating layer.

Referring to FIG. 10C, a channel layer C1 may be formed on the light-blocking layer LB1. The channel layer C1 may be disposed above the gate G1 and may have a width less than that of the gate G1. However, the width of the channel layer C1 with respect to the gate G1 may vary. If desired, the width of the channel layer C1 may be similar to that of the gate G1, or greater than that of the gate G1. The channel layer C1 may include an oxide semiconductor, but may also include a non-oxide semiconductor. A source electrode S1 and a drain electrode D1, which respectively contact both ends of the channel layer C1, may be formed. The source electrode S1 and the drain electrode D1 may be formed of the same material as that of the gate G1 or a different material than the gate G1.

The structures of transistors shown in FIGS. 2 and 3 may be manufactured by modifying the method of manufacturing a transistor described with reference to FIGS. 10A to 10C. Forming the structures of the transistors shown in FIGS. 2 and 3, as obvious to one of ordinary skill in the art, can be performed by modifying the method of manufacturing a transistor described above with reference to FIGS. 10A to 10C. Thus, descriptions thereof will be omitted herein.

FIGS. 11A to 11D are cross-sectional views illustrating a method of manufacturing a transistor, according to another example embodiment. According to the current embodiment, a method of manufacturing the transistor shown in FIG. 4 is provided.

Figure 11A:
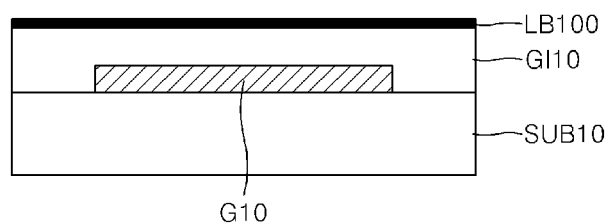
FIGS. 11A to 11D are cross-sectional views illustrating a method of manufacturing a transistor, according to another example embodiment.

Referring to FIG. 11A, a gate G10 may be formed on a substrate SUB10. A gate insulating layer GI1 may be formed so as to cover the gate G10. A light-blocking layer LB100 may be formed on the gate insulating layer GI10. The light-blocking layer LB100 may include a carbon-based material. The carbon-based material may be a conductor or insulator. For example, the conductor may be graphene or CNT, and the insulator may be graphene oxide or graphite oxide.

Figure 11B:
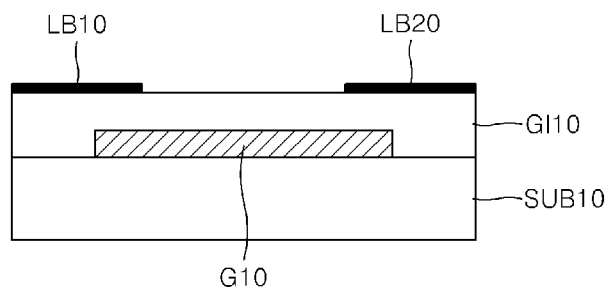

Referring to FIG. 11B, first and second light-blocking layers LB10 and LB20 may be formed by patterning the light-blocking layer LB100, and the gate insulating layer GI10 between the first and second light-blocking layers LB10 and LB20 may be exposed. The exposed portion of the gate insulating layer GI10 may be above the gate G10. A channel layer C10 (not shown) may be formed in the exposed portion of the gate insulating layer GI10 by a subsequent process.

Figure 11C:
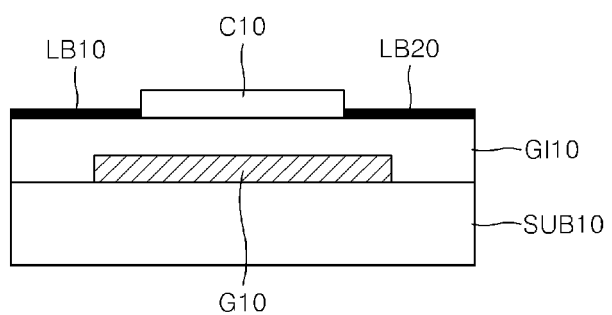

Referring to FIG. 11C, the channel layer C10 may be formed on the gate insulating layer GI10 between the first and second light-blocking layers LB10 and LB20. The channel layer C10 may have a width less than that of the gate G10. However, the width of the channel layer G10 with respect to the gate C10 may vary. The channel layer C10 may include an oxide semiconductor or a non-oxide semiconductor.

Figure 11D:
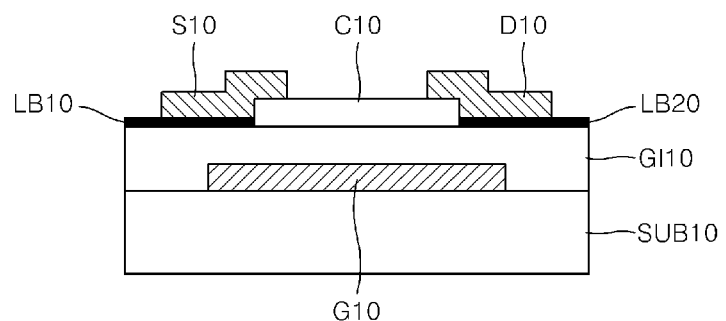

Referring to FIG. 11D, a source electrode 510 and a drain electrode D10, which respectively contact both ends of the channel layer C10, may be formed. The source electrode S10 and the drain electrode D10 may be formed of the same material as that of the gate G10 or a different material than the gate G10.

The structures of transistors shown in FIGS. 5 to 9 may be manufactured by modifying the method of manufacturing a transistor described with reference to FIGS. 11A to 11D. Forming the structures of the transistors shown in FIGS. 5 to 9, as obvious to one of ordinary skill in the art, can be performed by modifying the method of manufacturing a transistor described above with reference to FIGS. 11A to 11D. Thus, descriptions thereof will be omitted herein.

As described above, according to example embodiments, reliable high performance transistors of which variations in characteristics due to light are suppressed may be efficiently manufactured.

A transistor according to an example embodiment may be applied to a flat panel display device, such as a liquid crystal display device or an organic light-emitting display device, as a switching device or a driving device. As described above, a transistor according to an example embodiment has less characteristic variations due to light and desirable operational characteristics. Therefore, if a transistor according to an example embodiment is applied to a flat panel display device, the reliability and performance of the flat panel display device may be improved. Furthermore, a transistor according to an example embodiment may be applied not only to a flat panel display device, but also to various electronic devices, such as a memory device or a logic device, for various purposes.

Figure 12:
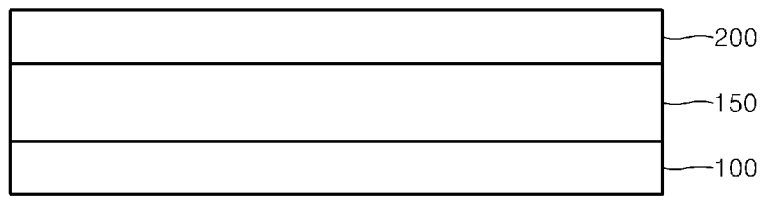
FIG. 12 is a cross-sectional view of an electronic device (flat panel display device) including a transistor, according to an example embodiment.

FIG. 12 is a cross-sectional view of an electronic device (flat panel display device) including a transistor, according to an example embodiment. The electronic device (flat panel display device) according to the current embodiment is a liquid crystal display device.

Referring to FIG. 12, a liquid crystal layer 150 may be disposed between a first substrate 100 and a second substrate 200. The first substrate 100 may be an array substrate including a transistor according to an example embodiment, for example, at least one of the transistors shown in FIGS. 1 to 9, as a switching device or a driving device. The first substrate 100 may include a pixel electrode (not shown) connected to the transistor. The second substrate 200 may include a counter electrode (not shown) corresponding to the pixel electrode. Alignment of the liquid crystal layer 150 may vary according to a voltage applied between the first substrate 100 and the second substrate 200. The electronic device including the transistor according to an example embodiment is not limited to the structure shown in FIG. 12 and structures of the electronic device may vary.

While the inventive concepts have been particularly shown and described with reference to example embodiments thereof, it will be understood by one of ordinary skill in the art that various changes in form and details may be made therein without departing from the spirit and scope of the appended claims. For example, it would have been obvious to one of ordinary skill in the art that structures of the transistors shown in FIGS. 1 to 9 may be modified variously. For example, light-blocking layers LB10 to LB13 and LB20 to LB23 of FIGS. 4 to 7 may include a semiconductor instead of a conductor or an insulator. Since graphene and CNT may have characteristics of semiconductors according to their structures or conditions for forming them, the light-blocking layers LB10 to LB13 and LB20 to LB23 may be formed using graphene or CNT having characteristics of semiconductors.

In addition, a transistor according to an example embodiment may have a double gate structure, and the channel layers C1 and C10 may have multi-layer structures. Furthermore, the methods of manufacturing a transistor described with reference to FIGS. 10A to 10C and FIGS. 11A to 11D may be modified variously. Furthermore, the structure of the flat panel display device shown in FIG. 12 may be modified variously. Furthermore, it would have been obvious to one of ordinary skill in the art that the idea of inventive concepts may be applied not only to an oxide thin film transistor, but also other transistors. Therefore, the scope of the inventive concepts is defined not by the detailed description but by the appended claims, and all differences within the scope will be construed as being included.

What is claimed is:

1. A transistor comprising:
a channel layer apart from a gate, the channel layer having first and second surfaces, the first surface being between the gate and the second surface;
a source contacting a first region of the channel layer and a drain contacting a second region of the channel layer; and
a light-blocking layer between the gate and at least one of the channel layer, the source and the drain, the light-blocking layer being configured to block laterally incident light toward the channel layer, and the light-blocking layer including a carbon-based material,
wherein the light-blocking layer overlaps whole of the bottom surfaces of the source and the drain, the bottom surfaces being outside of the channel layer in a horizontal direction, and
wherein the light-blocking layer is spaced apart from at least a center portion of the first surface of the channel layer.

2. The transistor of claim 1, wherein the carbon-based material has a bandgap less than about 5.0 eV.

3. The transistor of claim 1, wherein the light-blocking layer is a light-absorbing layer.

4. The transistor of claim 1, wherein the carbon-based material is an insulator.

5. The transistor of claim 4, wherein the carbon-based material includes at least one of graphene oxide and graphite oxide.

6. The transistor of claim 1, wherein the carbon-based material is a conductor.

7. The transistor of claim 6, wherein the carbon-based material includes at least one of graphene and carbon nanotube (CNT).

8. The transistor of claim 1, further comprising:
a gate insulating layer between the gate and the channel layer, the gate insulating layer including the light-blocking layer.

9. The transistor of claim 8, wherein the gate insulating layer comprises:
a first insulating layer between the gate and the channel layer; and
a second insulating layer between the first insulating layer and the channel layer,
wherein one of the first and second insulating layers is the light-blocking layer.

10. The transistor of claim 9, wherein the gate insulating layer further comprises:
a third insulating layer between the second insulating layer and the channel layer.

11. The transistor of claim 1, wherein a gate insulating layer is configured to cover the gate, and the channel layer, the source and the drain are disposed on the gate insulating layer.

12. The transistor of claim 11, wherein the light-blocking layer comprises:
a first light-blocking layer between the source and the gate insulating layer; and
a second light-blocking layer between the drain and the gate insulating layer.

13. The transistor of claim 12, wherein the first and second light-blocking layers are one of a conductor and an insulator.

14. The transistor of claim 12, wherein
the first light-blocking layer extends between the source and the channel layer, and the second light-blocking layer extends between the drain and the channel layer.

15. The transistor of claim 12, further comprising:
a third light-blocking layer between the gate and the gate insulating layer.

16. The transistor of claim 15, wherein the third light-blocking layer is one of a conductor and an insulator.

17. The transistor of claim 1, wherein the channel layer includes an oxide semiconductor.

18. The transistor of claim 1, wherein the channel layer includes a non-oxide semiconductor.

19. The transistor of claim 1, wherein the channel layer is on the gate.

20. The transistor of claim 1, wherein the gate includes an opaque material.

21. A transistor comprising:
a channel layer disposed apart from a gate, the channel layer having first and second surfaces, the first surface being between the gate and the second surface;

a source contacting a first region of the channel layer and a drain contacting a second region of the channel layer; and a light-blocking member configured to block laterally incident light toward the channel layer, the light-blocking member including a carbon-based material, wherein the light-blocking member overlaps whole of the bottom surfaces of the source and the drain, the bottom surfaces being outside of the channel layer in a horizontal direction, and wherein the light-blocking member is spaced apart from at least a center portion of the first surface of the channel layer.

22. The transistor of claim 21, wherein the carbon-based material is an insulator.

23. The transistor of claim 22, wherein the carbon-based material includes at least one of graphene oxide and graphite oxide.

24. The transistor of claim 21, wherein the carbon-based material is a conductor.

25. The transistor of claim 24, wherein the carbon-based material includes at least one of graphene and carbon nanotube (CNT).

26. A flat panel display device comprising the transistor of claim 1.

27. The flat panel display device of claim 26, wherein the transistor is used as one of a switching device and a driving device.

* * * * *